(12) United States Patent
Thiele et al.

(10) Patent No.: US 8,373,449 B2
(45) Date of Patent: Feb. 12, 2013

(54) CIRCUIT ARRANGEMENT INCLUDING A COMMON SOURCE SENSE-FET

(75) Inventors: Steffen Thiele, Munich (DE); Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 114 days.

(21) Appl. No.: 12/982,641

(22) Filed: Dec. 30, 2010

(65) Prior Publication Data

US 2012/0169377 A1 Jul. 5, 2012

(51) Int. Cl.
*H02M 1/00* (2007.01)
(52) U.S. Cl. .......................... 327/103; 327/530
(58) Field of Classification Search ............. 327/103
See application file for complete search history.

(56) References Cited

U.S. PATENT DOCUMENTS

| | | | |
|---|---|---|---|
| 5,945,708 A | 8/1999 | Tihanyi | |
| 6,284,604 B1 | 9/2001 | Tihanyi | |
| 6,700,365 B2* | 3/2004 | Isham et al. | 323/317 |
| 7,116,113 B1* | 10/2006 | Thompsen et al. | 324/601 |
| 7,126,354 B2* | 10/2006 | Deboy et al. | 324/713 |
| 7,344,945 B1* | 3/2008 | Pattanayak et al. | 438/270 |
| 7,372,685 B2* | 5/2008 | Beck et al. | 361/93.1 |
| 7,723,782 B2 | 5/2010 | Hirler | |
| 7,812,647 B2* | 10/2010 | Williams | 327/110 |
| 7,960,997 B2* | 6/2011 | Williams | 324/762.09 |
| 8,101,996 B2* | 1/2012 | Wang | 257/334 |
| 2001/0020732 A1 | 9/2001 | Deboy et al. | |
| 2002/0024376 A1 | 2/2002 | Sander | |
| 2009/0096531 A1* | 4/2009 | Shimamoto et al. | 330/297 |
| 2009/0166720 A1 | 7/2009 | Zundel | |
| 2010/0052637 A1* | 3/2010 | Lorentz et al. | 323/282 |
| 2010/0164553 A1* | 7/2010 | Ha et al. | 327/103 |
| 2010/0289473 A1* | 11/2010 | Ishii et al. | 323/284 |
| 2011/0057645 A1* | 3/2011 | Jager et al. | 324/125 |
| 2012/0081154 A1* | 4/2012 | Yoshikuni et al. | 327/103 |

FOREIGN PATENT DOCUMENTS

| | | |
|---|---|---|
| DE | 196 38 438 A1 | 4/1998 |
| DE | 100 42 585 C1 | 11/2002 |
| DE | 10 2004 041 886 A1 | 3/2006 |
| DE | 10 2005 041 285 A1 | 3/2007 |
| DE | 10 2006 045 869 A1 | 4/2008 |
| WO | WO2007/131947 | * 11/2007 |

* cited by examiner

*Primary Examiner* — Thomas J Hiltunen
(74) *Attorney, Agent, or Firm* — Slater & Matsil, L.L.P.

(57) ABSTRACT

A current sensing circuit arrangement is disclosed. The circuit arrangement includes a load transistor for controlling a load current to a load being coupled to a drain electrode of the load transistor. A sense transistor is coupled to the load transistor. The sense transistor has a drain electrode that provides a measurement current representative of the load current. The load transistor and the sense transistor are field effect transistors having a common source electrode. A measurement circuit is configured to receive the measurement current from the sense transistor and to generate an output signal therefrom, the output signal being representative of the load current.

11 Claims, 4 Drawing Sheets

CIRCUIT ARRANGEMENT INCLUDING A COMMON SOURCE SENSE-FET

TECHNICAL FIELD

The present invention relates to the field of current sensing of transistor load currents using so-called Sense-Transistors.

BACKGROUND

Current sensing circuits using so-called current sensing transistors (or "sense FETs") have been commonly used for years. Such current sensing techniques may be especially useful when measuring the load current of power field effect transistors (power FETs) which are composed of a plurality of transistor cells as illustrated, for example, in U.S. Patent Application Pub. No. 2001/0020732 A1. Such power field effect transistors have a common drain region for all transistors cells composing the power transistor component. The common drain region is connected by one drain electrode arranged on the back-side of a wafer whereas the source region and the respective source electrodes are contacted on the front-side of the wafer and connected in parallel. The source electrode of a one transistor cell (referred to as "sense cell") may be separately connected to tap a current signal that is representative of the load current flowing through the plurality of transistor cells of the load transistor. Of course a few transistor cells may be connected in parallel to form the sense transistor.

In circuit arrangement including a load transistor/sense transistor pair the source current of the sense current is directly proportional to the source current of the load transistor whereby the factor of proportionality results from the ratio of the current conducting area of the load transistor and the current conducting area of the sense transistor which is (at least approximately) equivalent to the ratio of the number of transistor cells in the load transistor and, respectively, the sense transistor.

The proportionality condition mentioned above is only met when both transistors (load transistor and sense transistor) operate in the same operating point, i.e., when both transistors are supplied with the same gate-source voltage and are exposed to the same drain-source voltage. A number of circuitry is known which may be applied to ensure that both transistors operate in the same operating point. Just to give an example, for common drain MOS technologies an operational amplifier may be used to set the source-voltage of the sense transistor to match the source-voltage of the load transistor. Due to the common drain electrode an equal drain-source-voltage is achieved. Additionally, the gate electrodes of sense transistor and load transistor are connected so as to provide the same gate-source voltage to both transistors.

Although the sense transistor and load transistor operate in the same operating point due to appropriate circuitry, further undesired side effects and interactions between the both transistors may deteriorate the strict proportionality between the respective source currents. For example, the homogeneous drain current density is to be ensured throughout the transistor cells (of both transistors). An inhomogeneous drain current flow may result in internal traverse currents thus distorting the strict proportional relationship between the source current of the sense transistor and the load transistor.

Due to the structure of the transistors (common drain on the back-side of the wafer, separated source contact for the sense transistor cell) n-type transistors (e.g., n-channel MOSFETs) have to be used as high side switches and p-type transistors (e.g., p-channel MOSFETs) for low side switches. In both cases the source electrodes are exposed to the full voltage swing and, as a consequence, appropriate protection circuitry is required in order to protect the gate oxide which is typically not designed to withstand high voltage differences.

SUMMARY

In view of the above there is a general need for improved current sensing circuit arrangements which (at least partially) solve or alleviate the problems arising when using known sense transistor circuits.

A current sensing circuit arrangement is disclosed. In accordance with one example of the invention the circuit arrangement comprises a load transistor for controlling a load current to a load being coupled to a drain electrode of the load transistor. A sense transistor is coupled to the load transistor. The sense transistor has a drain electrode that provides a measurement current representative of the load current. The load transistor and the sense transistor are field effect transistors having a common source electrode. A measurement circuit is configured to receive the measurement current from the sense transistor and to generate an output signal therefrom, the output signal being representative of the load current.

In accordance with another example of the invention, a circuit arrangement comprises a first load transistor for controlling a load current to a first load being coupled to a drain electrode of the first load transistor. A second load transistor controls a load current to a second load that is coupled to a drain electrode of the second load transistor. A sense transistor is configured to be coupled to the first or the second load transistor in accordance to a switching signal. The sense transistor has a drain electrode that provides a measurement current representative of the load current of the load transistor coupled thereto, and the first and the second load transistor and the sense transistor are field effect transistors having a common source electrode. A measurement circuit is configured to receive the measurement current from the sense transistor and to generate an output signal therefrom, the output signal being representative of the load current of the load transistor of the load transistor coupled to the sense transistor.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
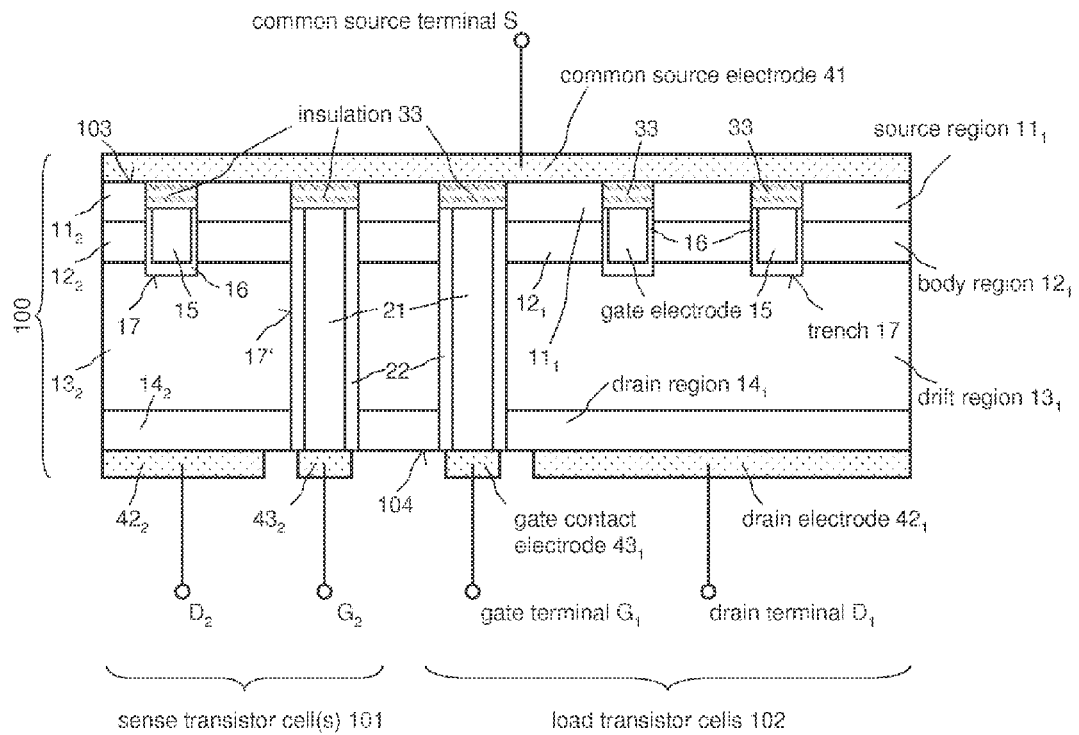
FIG. 1 is a cross-sectional view through a vertical common source power MOSFET component used in various examples of the present invention.

FIG. 1 is a cross-sectional view illustrating (at least partially) two separate field effect transistor (FET) components having a common source electrode but separated drain electrodes. A plurality of transistor cells is integrated in a semiconductor body 100. From these transistor cells at least one transistor cell 101 forms a sense transistor and a multitude of transistor cells 102 form a load transistor. In contrast to typical vertical power transistor components, a metallization layer arranged on the top surface 103 of the semiconductor body 100 (i.e., the front side of the semiconductor body 100) forms a common source electrode 41 that is shared by several transistor components.

In the present example the common source electrode 41 is shared by the transistor cell(s) 101 forming the sense transistor and the transistor cells 102 forming the load transistor. The transistor cells are defined by so-called trenches 17 that extend into the semiconductor body 100 starting from the top surface 103 of the semiconductor body 100. Gate electrodes 15 (typically made of polysilicon) are arranged within the trenches 17 and isolated from the surrounding semiconductor body 100 by means of an isolation layer 16, which is typically an oxide layer.

The semiconductor body 100 includes source regions $11_1$, $11_2$, body regions $12_1$, $12_2$, drift regions $13_1$, $13_2$ and drain regions $14_1$, $14_2$. Wherein the subscript 1 indicates that the corresponding region belongs to the load transistor 102 and the subscript 2 indicates that the respective region belongs to the sense transistor 101. Source regions, body regions, drift regions and drain regions may be produced using epitaxial growth, ion implantation or diffusion of doping materials dependent on the production technology used. The source region $11_1$, $11_2$ extends along the top surface 103 of the semiconductor body 100 (and essentially parallel thereto) and is directly contacted by the common source electrode 41. The drain regions $14_1$, $14_2$ extend along the bottom surface 104 of the semiconductor body 100 and are directly contacted by the drain electrodes $42_1$, $42_2$ arranged on the bottom surface 104 of the semiconductor body 100. Between the source regions $11_1$, $11_2$ and the drain regions $14_1$, $14_2$, the body regions $12_1$, $12_2$ as well as the drift regions $13_1$, $13_2$ extend parallel to the top and the bottom surfaces 103, 104 of the semiconductor 100.

The body regions $12_1$, $12_2$ are arranged adjacent to the trenches 17. That is, the trenches extend from the top surface 103 of the semiconductor body 100 into the semiconductor body so deep that the trench bottom reaches the corresponding drift zone $13_1$ (or, respectively, $13_2$). In an active transistor, load current flows from the source regions $11_1$, $11_2$ to the drain regions $14_1$, $14_2$, respectively, via the corresponding body regions $12_1$, $12_2$ and drift regions $13_1$, $13_2$, respectively, whereby a channel of charge carriers forms a long side the sidewalls of the trenches 17 under the influence of the electric field due to the charged gate electrodes 15.

An isolation layer 33 covering the trenches 17 isolates the gate electrodes 15 arranged in the trenches 17 from the common source electrode 41 arranged on the top surface of the semiconductor body 103.

Some deep trenches 17' extend from the top surface 103 of the semiconductor body 100 down to the bottom surface 104 so as to allow for through-connections 21. For this purpose the deep trenches 17' are usually filled with polysilicon that forms the electrical through-connection 21. Similar to the gate electrodes 15 the polysilicon forming the through-connection 21 is isolated from the surrounding semiconductor body 100 by means of an insulation layer 22 which is usually a silicon oxide layer. The gate electrodes belonging to a specific transistor component (e.g. load transistor 102) are typically electrically interconnected with a corresponding through-connection 21 so as to facilitate an electrical connection of the gates at the bottom surface 104 of the semiconductor body 100. For this reason, the through-connections 21 are covered by respective metallization layers at the bottom surface 103 forming gate contact electrodes $43_1$ and $43_2$.

If the gate electrodes $43_1$ and $43_2$ of the transistor components 101, 102 should be connected in parallel, only one deep trench 17' is required that allows for contacting the common gate electrodes arranged in the trenches 17. An electrical connection between the gate electrodes 15 arranged in the trenches and the through-connection 21 arranged in a deep trench may be realized by a transversal trench (not shown) which extends in a plane parallel to the cross sectional plane illustrated in FIG. 1 thus connecting corresponding trenches 17 and deep trenches 17'.

As can be seen from FIG. 1, a deep trench 17' separates two different transistor components, that is sense transistor 101 and load transistor 102 in the present example. In contrast to known vertical transistors, in which a multitude of transistor cells share a common drain electrode (see, for example, U.S. Patent Pub. No. 2001/0020732 A1), the transistor cells illustrated in FIG. 1 share a common source electrode, have separated drain electrodes, and (optionally) separated gate electrodes. As the deep trenches 17' provide for a complete separation of the body and the drift zones of two different transistor components 101, 102, a more homogenous current distribution is achieved in the drift zones. Further, parasitic semiconductor components are suppressed by inhibiting transfers current within the drift zones $13_1$, $13_2$. These advantages make common source, separated drain transistors, much more appropriate for current sensing.

Figure 2:
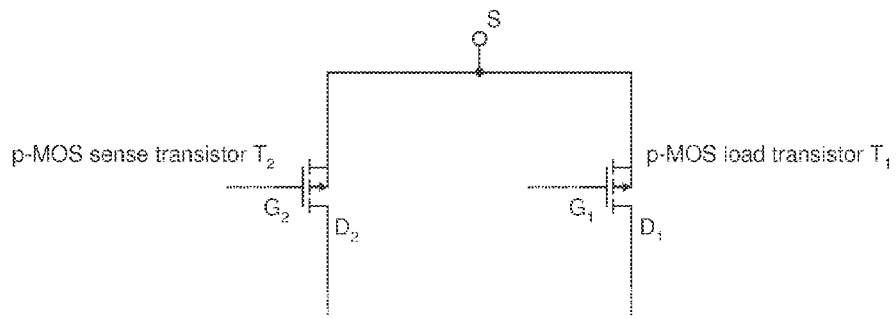
FIG. 2 illustrates a schematic diagram of the transistor of FIG. 1.

FIG. 2 illustrates the transistor components 101, 102 of FIG. 1 schematically in the circuit diagram, whereby the transistor component 101 is denoted as P-MOS sense transistor T2 and the load transistor component 102 is denoted as P-MOS loss transistor T1 in FIG. 2. The source terminals of both transistors are necessarily connected in parallel as the transistor cells forming the transistors share a common source electrode (see common source electrode 41 in FIG. 1).

Figure 3:
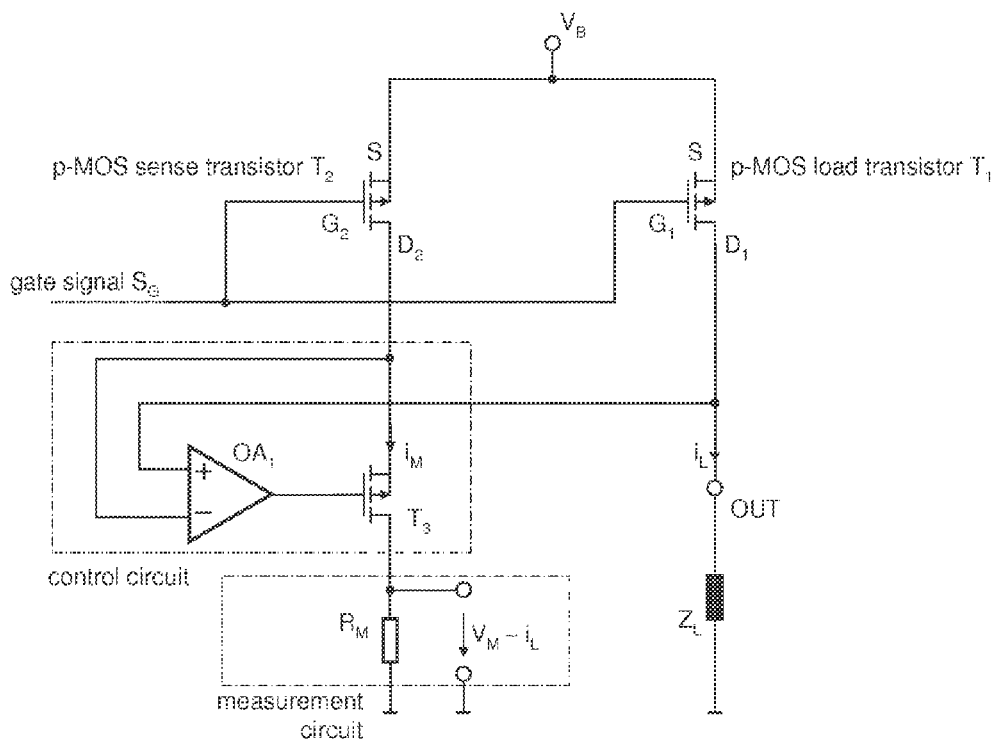
FIG. 3 illustrates, as a first example of the present invention, a current sensing circuit arrangement including a sense transistor/load transistor pair in accordance with the example of FIG. 1.
Figure 5:
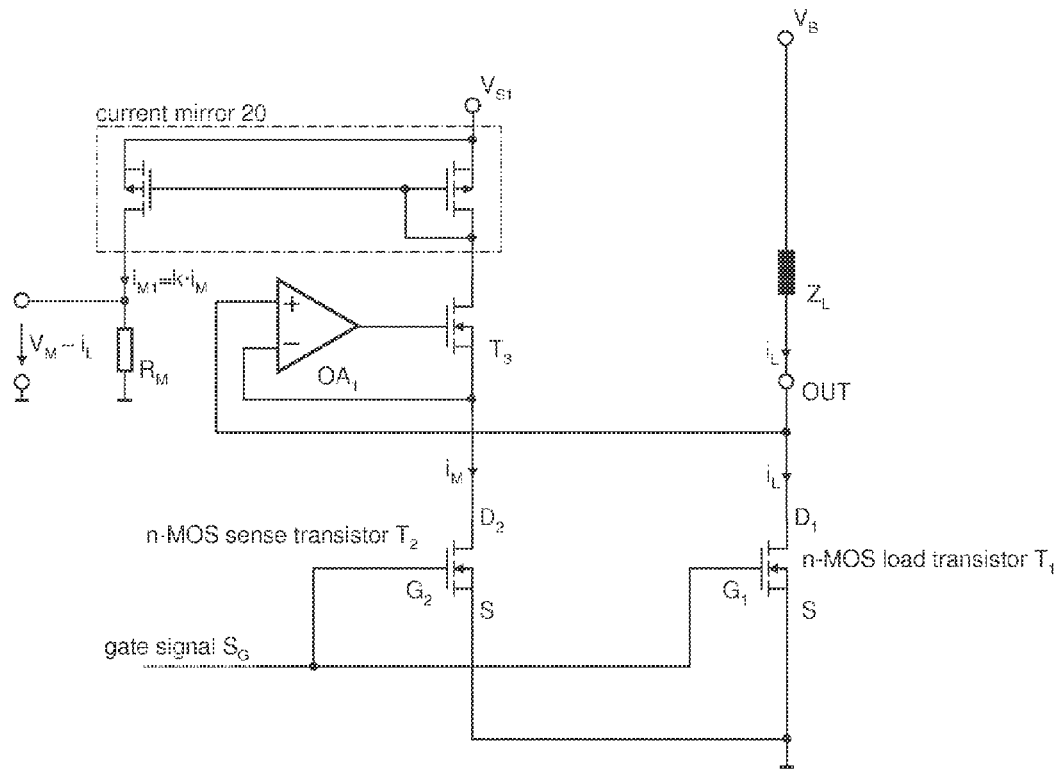
FIG. 5 illustrates, as a third example of the present invention, a circuit arrangement similar to the example of FIG. 3, in contrast to the example of FIG. 3 current sensing is performed at a low side transistor.

FIG. 3 illustrates one application of a common source, separated drain transistor pair (sense transistor, load transistor) as illustrated in FIG. 2. In the example of FIG. 3, the common source transistors $T_1$, $T_2$ are p-channel MOSFETs in a high side configuration. That is, the common source terminal S (and thus the common source electrode, see reference numeral 41 in FIG. 1) of the sense transistor $T_2$ and the load transistor $T_1$ is connected to a high side supply potential $V_B$. A similar circuit using n-channel MOSFETs in a low-side configuration is illustrated in FIG. 5.

In the example of FIG. 3 a load impedance $Z_L$ is connected between a drain terminal $D_1$ of the load transistor $T_1$ and a low side supply potential (also called reference potential which may be ground). The load transistor controls a load current $i_L$ supplied to the (e.g. external) load impedance $Z_L$ via output terminal OUT. The load current control is performed in accordance with a gate signal $S_G$ supplied to gate terminals $G_1$ and $G_2$ (and thus to the gate contact electrodes, see reference numerals $43_1$, $43_2$ in FIG. 1) of the load transistor $T_1$ and the sense transistor $T_2$, respectively.

When both transistors $T_1$ and $T_2$ are operated in the same operating point (also referred to as bias point or quiescent point) a measurement current $i_M$ flowing through the source-drain path of the sense transistor is (approximately) direct proportional to the load current $i_L$ flowing through the source-drain path of the load transistor. For this purpose a control circuit is employed that is configured to regulate the drain voltage of the sense transistor $T_2$ to be equal to the drain voltage of the load transistor $T_1$. One example of an appropriate control circuit is illustrated in FIG. 3. Accordingly the control circuit includes an operational amplifier $OA_1$ and an further transistor $T_3$ to regulate the drain potential of the sense transistor $T_2$ so as to match the drain potential of the load transistor $T_1$. The ratio $i_M/i_L$ between the measurement current $i_M$ and the load current $i_L$ is then determined by the ratio between the area of the respective transistors or, approximately, of the ratio of the number of active transistor cells of the respective transistors.

The load path (source-drain current path) of the further transistor $T_3$ is connected in series to the load path of the sense transistor $T_3$. The gate of the further transistor T3 is thereby coupled to and driven by the output of the operational amplifier $OA_1$ whose inputs ate connected to the drain terminals $D_1$ and $D_2$ of the load transistor $T_1$ and the sense transistor $T_2$, respectively.

Further a measurement circuit is provided configured to generate an output signal that is representative of the load current. In a very simple configuration the measurement circuit includes a resistor $R_M$ connected in series to the sense transistor $T_2$ (and, if present, to the further transistor $T_3$) in order to generate a voltage drop $V_M = i_M \cdot R_M$ across the resistor $R_M$ that can be used as output signal.

Using p-channel MOSFETs as high side transistors reduces the required complexity of the gate drivers (not shown) used for generating appropriate gate signals $V_G$. As the source potential is constant (supply potential $V_B$ in the present example) less effort is required to protect the gate insulation (see gate oxide layer 16) from over-voltage breakthrough. Further, as the transistors $T_1$ and $T_2$ are completely separated and thus decoupled by the deep trenches 17' (see FIG. 1) the proportionality between the drain currents $i_M$ and $i_L$ is improved significantly and thus the quality of the current sensing. Further, due to the fact that the gate-source-voltages of the sense transistor and the load transistor remain identical at all times, a separate protection of the gate-source paths is not necessary. This, in contrast, is always an issue when using n-channel high side transistors.

Figure 4:
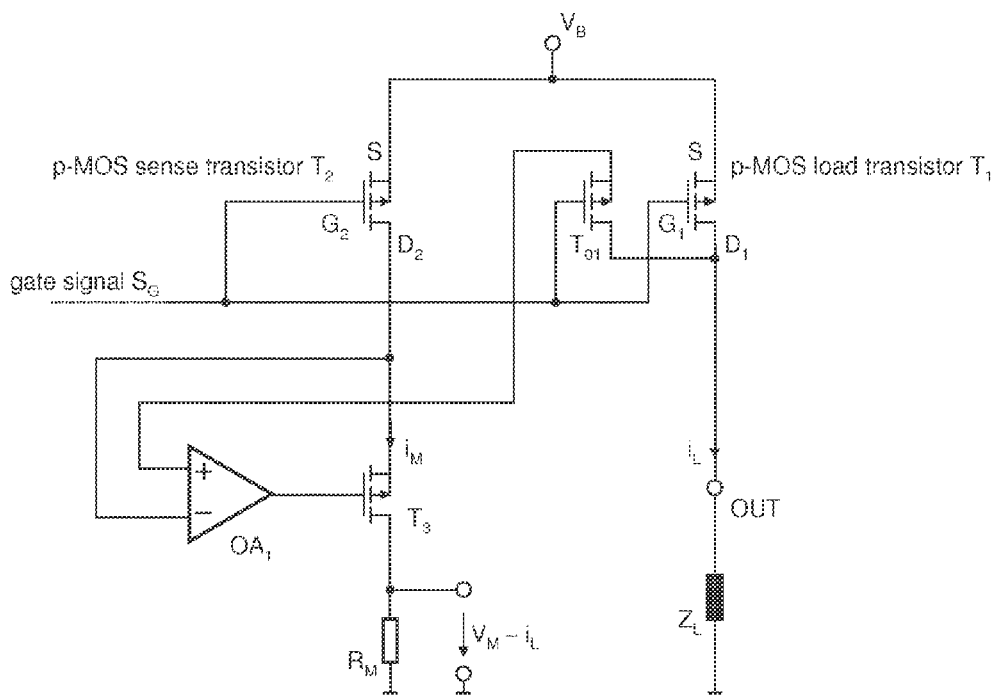
FIG. 4 illustrates, as a second example of the present invention a circuit arrangement similar to the example of FIG. 3.

FIG. 4 illustrates an example very similar to the example of FIG. 3. The circuit of FIG. 3 corresponds to the circuit of FIG. 4. However, the in the circuit of FIG. 4 the control circuit comprises an additional transistor $T_{01}$ coupled in parallel to the load transistor in order to allow a current-less connection of the drain potential of the load transistor $T_1$. When load transistor $T_1$ and sense transistor $T_2$ are actively driven into a conducting on state, the additional transistor $T_{01}$ is conductive, too, and provides the drain potential of the load transistor $T_1$ to the operational amplifier OA1. In case of a decreasing drain voltage at load transistor $T_1$ (e.g. when driving the transistor into an off state) the additional transistor $T_{01}$ protects the input of the operational amplifier as the drain-source path of transistor $T_{01}$ takes over the voltage drop. Despite of the additional transistor $T_{01}$ for tapping the drain potential of the load transistor the function of the examples of FIG. 3 and FIG. 4 is identical.

FIG. 5 illustrates a further example which may be seen as "inverted" version of the example of FIG. 3. Accordingly, n-channel MOSFETs are used as sense transistor $T_2$ and load transistor $T_1$. Sense transistor $T_2$ and load transistor $T_1$ are connected as low side transistors, i.e. their common source terminal S (and thus their common source electrode, see reference numeral 41 in FIG. 1) is connected to a low side supply potential which is, in the present example, ground potential. Similar to the example of FIG. 3 a load impedance $Z_L$ is connected between the drain terminal $D_1$ of the load transistor $T_1$ and the high side supply potential $V_B$. The load current supplied to the load impedance $Z_L$ by the load transistor $T_1$ is again denoted as $i_L$. As in the example of FIG. 3 the gates of both transistors receive the same gate driver signal $S_G$ provided by an appropriate gate driver circuit (not shown). Consequently, the drain current $i_M$ of the sense transistor is (approximately) proportional to the load current $i_L$ if the potential of the drain electrode (cf. reference numeral $43_2$ in FIG. 1) of the sense transistor $T_2$ is equal to the potential of the drain electrode (see reference numeral $43_1$ in FIG. 1) of the load transistor $T_1$.

In the current example, a control circuit for tuning the drain potential of the sense transistor $T_2$ may comprise an operational amplifier $OA_1$ and a further transistor $T_3$ which are connected to the transistors $T_1$ and $T_2$ analogously as in the example of FIG. 3. However, in contrast to the example of FIG. 3, the measurement current $i_M$ provided by the sense transistor $T_2$ is only accessible for measurement at the high side of the circuit arrangement. In order to obtain an output signal with respect to the low side supply potential (i.e., ground potential) a current mirror 20 may be connected to the current path of the measurement current $i_M$ so as to provide a second measurement current $i_{M1}$ equal or proportional to the measurement current $i_M$ and thus proportional to the load current $i_L$. The "mirrored" current $i_{M1}$ may be fed into a resistor $R_M$ similar to the circuit of FIG. 3 so as to provide an output voltage signal $V_M = R_M \cdot i_{M1}$ representative of the load current $i_L$.

Figure 6:
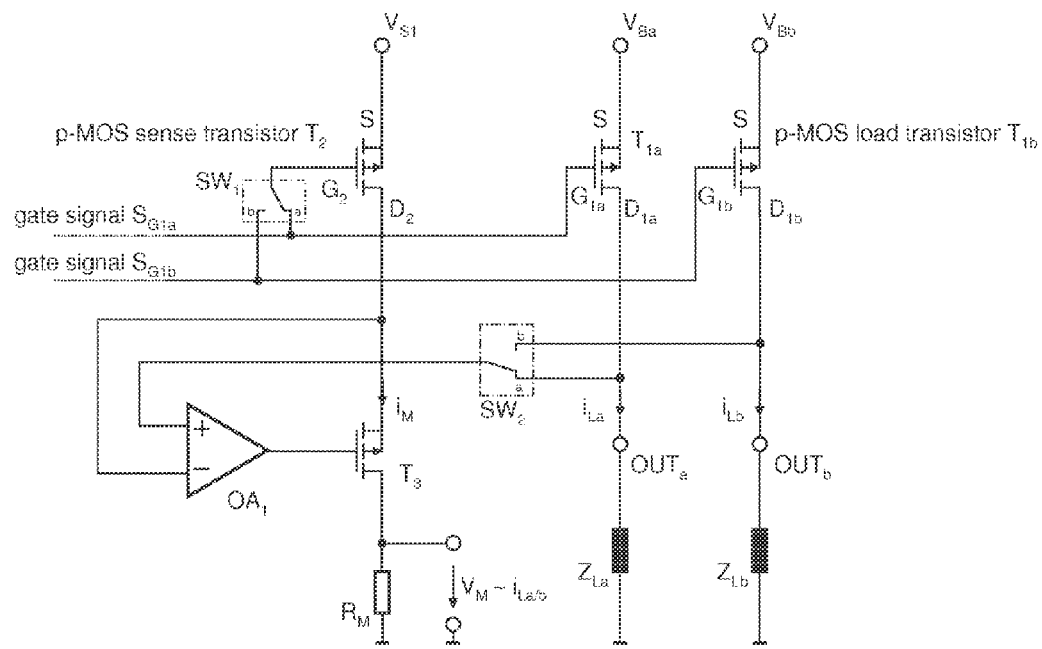
FIG. 6 illustrates, as a further example of the present invention, a circuit arrangement including two high side load transistors sharing one switchable sense transistor.

The example of FIG. 6 illustrates an enhancement of the example of FIG. 3. Accordingly, a sense transistor $T_2$ is used in the same way as in FIG. 3. However, the sense transistor $T_2$ can be switchably connected to either a first load transistor $T_{1a}$ or a second load transistor $T_{1b}$ by means of (e.g. semiconductor) switches $SW_1$ and $SW_2$. Once connected to a specific load transistor (load transistor $T_{1a}$ or $T_{1b}$) the circuit arrangement operated—with respect to the connected load transistor—identically to the example of FIG. 3. Thus, one sense transistor $T_2$ may be used for current measurement at a number of different load transistors $T_{1a}$, $T_{1b}$. For this purpose the gate terminal $G_2$ is switchably (see switch $SW_1$) connected to the gate of either the first load transistor $T_{1a}$ or the second load transistor $T_{1b}$ in accordance with a switching signal that controls the switching state of the switch $SW_1$. Further, one input of the operational amplifier $OA_1$ is switchably (see switch $SW_2$) connected the to the drain of either the first load transistor $T_{1a}$ or the second load transistor $T_{1b}$ in accordance with a switching signal that controls the switching state of the switch $SW_2$. The switching signal may be the same for both switches $SW_1$ and $SW_2$.

Figure 7:
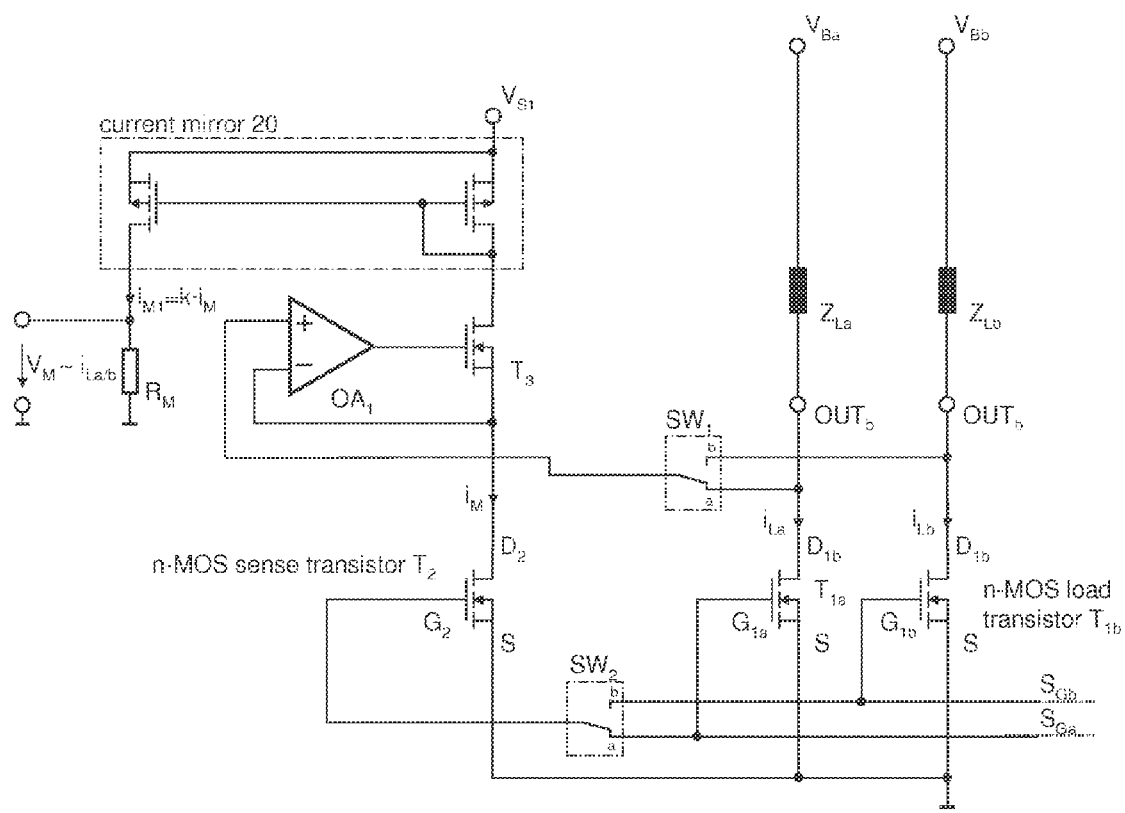
FIG. 7 illustrates, as a further example of the present invention, a circuit arrangement including two low side load transistors sharing one switchable sense transistor.

The circuit of FIG. 7 corresponds to the circuit of FIG. 6 in the same way as the circuit of FIG. 5 corresponds to the circuit of FIG. 3. The example of FIG. 7 includes re-channel common source transistors connected in a low-side configuration wherein one sense transistor is shared by at least two load transistors in a way analogous to the example of FIG. 6.

A "sharing" of the sense transistor $T_2$ by at least two load transistors would not be possible when using conventional common drain power MOSFETs as load and sense transistors. As, in common circuits, the source potential of the sense transistor has to follow the source potential of the load transistor. This is necessary as the source electrodes can not withstand high voltages. However, when using a common source technology as in accordance with the above described embodiments, this problem does not exist.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A circuit arrangement comprising:
   a first load transistor configured to control a load current to a first load coupled to a drain electrode of the first load transistor;
   a second load transistor configured to control a load current to a second load coupled to a drain electrode of the second load transistor;
   a sense transistor configured to be coupled to the first or the second load transistor in accordance to a switching signal, the sense transistor having a drain electrode that provides a measurement current representative of the load current of the load transistor coupled thereto, wherein the first and the second load transistors and the sense transistor comprise field effect transistors having a common source electrode; and
   a measurement circuit configured to receive the measurement current from the sense transistor and to generate an output signal therefrom, the output signal being representative of the load current of the load transistor of the load transistor coupled to the sense transistor.

2. The circuit arrangement of claim 1, further comprising:
   a first switch configured to be coupled a gate contact electrode of the sense transistor with a gate contact electrode of the first load transistor or with a gate contact electrode of the second load transistor in accordance with the switching signal.

3. The circuit arrangement of claim 1, wherein the first and the second load transistors and the sense transistor comprise p-channel MOS transistors whose common source electrode is coupled to a high side supply potential.

4. The circuit arrangement of claim 1, wherein the first and the second load transistors and the sense transistor comprise n-channel MOS transistors whose common source electrode is coupled to a low side supply potential.

5. The circuit arrangement of claim 1, wherein the measurement circuit comprises a control circuit that is configured to tune a drain potential of the sense transistor to be equal to a drain potential of the load transistor coupled to the sense transistor.

6. The circuit arrangement of claim 5, wherein the measurement circuit further comprises an output circuit receiving the measurement current and configured to provide, as the output signal, a voltage signal representing the measurement current.

7. The circuit arrangement of claim 6, wherein the output circuit comprises a resistor, a voltage drop across the resistor being the voltage signal representing the measurement current.

8. The circuit arrangement of claim 5, wherein the measurement circuit further comprises an output circuit comprising a current minor that receives the measurement current and is configured to provide, as the output signal, a current signal proportional to the measurement current.

9. The circuit arrangement of claim 1 further comprising:
   a semiconductor body; and
   a plurality of transistor cells integrated in the semiconductor body, at least one of the transistor cells forming the sense transistor and a plurality of transistor cells forming the load transistor.

10. The circuit arrangement of claim 9,
    wherein each transistor cell comprises a gate, a source region, a body region, a drift region and a drain region;
    wherein the gates and the drain regions of the transistor cells forming the load transistor are connected in parallel;
    wherein the drain region(s) of the transistor cell(s) forming the sense transistor are isolated from the drain regions of the transistor cells forming the load transistor(s); and
    wherein the source regions of all of the plurality of transistor cells are electrically connected in parallel by a top metallization on a front-side of the semiconductor body.

11. The circuit arrangement of claim 9, wherein drain electrodes and gate contact electrodes are arranged on a back-side of the semiconductor body, wherein the gates of the transistor cells forming the load transistor(s) are connected to a corresponding gate contact via a through-connection extending from a front-side of the semiconductor body to the back-side of the semiconductor body.

* * * * *

UNITED STATES PATENT AND TRADEMARK OFFICE
CERTIFICATE OF CORRECTION

| | |
|---|---|
| PATENT NO. | : 8,373,449 B2 |
| APPLICATION NO. | : 12/982641 |
| DATED | : February 12, 2013 |
| INVENTOR(S) | : Steffen Thiele |

It is certified that error appears in the above-identified patent and that said Letters Patent is hereby corrected as shown below:

In the Claims

In Col. 8, line 27, claim 8, delete "minor" and insert --mirror--.

Signed and Sealed this
Twenty-second Day of April, 2014

Michelle K. Lee
*Deputy Director of the United States Patent and Trademark Office*